United States Patent
Wood

(10) Patent No.: US 7,209,065 B2
(45) Date of Patent: Apr. 24, 2007

(54) ROTARY FLASH ADC

(75) Inventor: John Wood, Santa Cruz, CA (US)

(73) Assignee: Multigig, Inc., Scotts Valley, CA (US)

( * ) Notice: Subject to any disclaimer, the term of this patent is extended or adjusted under 35 U.S.C. 154(b) by 0 days.

(21) Appl. No.: 11/191,231

(22) Filed: Jul. 26, 2005

(65) Prior Publication Data

US 2006/0071844 A1 Apr. 6, 2006

(30) Foreign Application Priority Data

Jul. 27, 2004 (GB) .................................. 0416803

(51) Int. Cl.
*H03M 1/12* (2006.01)

(52) U.S. Cl. ........................................ 341/155; 331/17

(58) Field of Classification Search ................ 341/155, 341/157, 164; 331/17, 59

See application file for complete search history.

(56) References Cited

U.S. PATENT DOCUMENTS 2,801,281 A 7/1957 Oliver et al. ............... 178/43.5

(Continued)

FOREIGN PATENT DOCUMENTS

DE 43 22 701 8/1994

(Continued)

OTHER PUBLICATIONS

Bußmann, M. et al. (1992). "Active Compensation of Interconnect Losses for Multi-GHz Clock Distribution Networks," *IEEE Transactions on Circuits and Systems—II: Analog and Digital Signal Processing*, vol. 39(11): 790-798, No month.

(Continued)

*Primary Examiner*—Peguy JeanPierre
(74) *Attorney, Agent, or Firm*—Dechert LLP; Anthony B Diepenbrock, III

(57) ABSTRACT

A system and method for converting an analog signal to a digital signal is disclosed. The system includes a multiphase oscillator preferable a rotary oscillator, a sample and hold circuit, an integrator and a time-to-digital converter. The multiphase oscillator has a plurality of phases that are used in the time-to-digital converter to measure the time of a pulse created by the integrator. The edges of the pulse may optionally be sharpened by passing the pulse through a non-linear transmission line to improve the accuracy of the measurement process. To cut down on noise a tuned power network provides power to the switching devices of the rotary oscillator. Calibration is performed by fragmenting the sample and hold circuit and integrator and performing a closed loop calibration cycle on one of the fragments while the other fragments are joined together for the normal operation of the sample and hold and integrator circuits.

17 Claims, 5 Drawing Sheets

U.S. PATENT DOCUMENTS

| | | | |
|---|---|---|---|
| 2,872,670 A | 2/1959 | Dickinson et al. | 340/347 |
| 3,516,021 A | 6/1970 | Kohn | |
| 3,538,450 A | 11/1970 | Andrea et al. | 331/10 |
| 4,246,550 A | 1/1981 | Cohen | 331/107 |
| 4,514,707 A | 4/1985 | Dydyk et al. | 331/107 |
| 4,686,407 A | 8/1987 | Ceperley | 310/323 |
| 4,749,963 A | 6/1988 | Makimoto et al. | 331/99 |
| 4,875,046 A | 10/1989 | Lewyn | 341/148 |
| 4,998,109 A | 3/1991 | LeChevalier | 341/166 |
| 5,117,206 A | 5/1992 | Imamura | 331/158 |
| 5,235,335 A | 8/1993 | Hester et al. | 341/172 |
| 5,361,277 A | 11/1994 | Grover | 375/107 |
| 5,493,715 A | 2/1996 | Humphreys et al. | 455/264 |
| 5,584,067 A | 12/1996 | V. Buer et al. | 455/302 |
| 5,640,112 A | 6/1997 | Goto et al. | 327/141 |
| 5,652,549 A | 7/1997 | Unterricker et al. | 331/57 |
| 5,754,833 A | 5/1998 | Singh et al. | 395/551 |
| 5,793,709 A | 8/1998 | Carley | 368/113 |
| 5,825,211 A * | 10/1998 | Smith et al. | 327/19 |
| 5,945,847 A | 8/1999 | Ransijn | 326/115 |
| 5,963,086 A | 10/1999 | Hall | 330/10 |
| 5,973,633 A | 10/1999 | Hester | 341/172 |
| 6,002,274 A * | 12/1999 | Smith et al. | 327/19 |
| 6,078,202 A | 6/2000 | Tomatsuri et al. | 327/145 |
| 6,133,798 A | 10/2000 | Nagano et al. | 331/55 |
| 6,239,663 B1 | 5/2001 | Mizutani | 331/107 |
| 6,259,327 B1 | 7/2001 | Balistreri et al. | 331/11 |
| 6,356,218 B1 * | 3/2002 | Brown et al. | 341/120 |
| 6,429,693 B1 | 8/2002 | Staszewski et al. | 327/12 |
| 6,683,503 B2 | 1/2004 | Mizuno et al. | 331/46 |
| 6,707,411 B1 * | 3/2004 | Poulton et al. | 341/155 |
| 2006/0022720 A1 * | 2/2006 | Wood | 327/94 |

FOREIGN PATENT DOCUMENTS

| | | |
|---|---|---|
| EP | 0 478 134 | 4/1992 |
| EP | 0 583 839 A1 | 2/1994 |
| EP | 0 633 662 A1 | 6/1994 |
| EP | 0 696 843 A1 | 2/1996 |
| EP | 0 891 045 | 1/1999 |
| GB | 1 247 199 | 9/1971 |
| WO | WO 95/12263 | 5/1995 |
| WO | WO 00 44093 | 7/2000 |

OTHER PUBLICATIONS

Deutsch, Alena et al., "Modeling and characterization of long on-chip interconnections for high-performance microprocessors" *IBM J Res. Develop.* vol 39, No. 5, Sep. 1995, pp. 547-567 (p. 549).

Divina et al., "The Distributed Oscillator 4 GHZ," May 1998, pp. 1-4, *IEEE*.

Dunning, Jim, "An All-Digital Phase-Locked Loop with 50-Cycle Lock Time Suitable for High-Performance Microprocessors," *IEEE Journal of Solid-State Circuits*, vol. 30, No. 4, Apr. 1995, pp. 412-422.

H. Wu and A Hajimiri, "A 10 GHz CMOS Distribute Voltage Controlled Oscillator," *Proc. of IEEE Custom Integrated Circuits Conference*, pp. 581-584, May 2000.

Hajimiri et al., "A 10GHz CMOS Distributed Voltage Controlled Oscillators,"Department of Electrical Engineering, California Institute of Technology, Pasadena, CA 91125, USA, no date.

Hall, L. et al. (1997). "Clock Distribution Using Cooperative Ring Oscillators,m" *Proceedings of the 17th Conference on Advanced Research in VLSI*, Ann Arbor, MI (Sep. 15-16, 1997 pp. 62-75.

Hatsuhiro Kato: "A Dynamic Formulation of Ring Oscillator as Solitary-Wave Propagator," *IEEE Transactions on Circuits and Systems-I: Fundamental Theory and Applications*, vol. 45, No. 1, Jan. 1998, pp. 98-101, XP002168328, the whole document.

Hirofumi Nagashino et al.: "Generation of Traveling Wave Mode in a Chained Neural Oscillator Network Model," *Proceedings of the International Conference on Neural Networks*, (ICNN), US, New York, IEEE, vol. -, Mar. 28, 1993, pp. 1550-1557, XP000379507, ISBN: 0-7803-0999-5, the whole document.

Hiroyuki Tabuki et al.: "Miniaturized Stripline Dual-Mode Ring Resonators and Their Application to Oscillating Devices." *IEEE MTT-s International Microwave Symposium Digest*, US, New York, IEEE, May 16, 1995, pp. 1313-1316, XP000552959, ISBN: 0-7803-2582-6, the whole document.

International Search Report for PCT/GB01/02069, Jul. 9, 2001.

International Search Report: ref: Pct/GB02/05514, Jan. 29, 2004.

Kim et al., "ISSCC 2000/Session 26/Analog Techniques/Paper WP 26.3," 2000, pp. 430-431 & 475, 2000 *IEEE International Solid-State Circuits Conference*, no month.

Kleveland et al., "Monolithic CMOS Distributed Amplifier and Oscillator," 1999 *IEEE International Solid-State Circuits Conference*, no month.

Kleveland et al., "MP 4.3 Monolithic CMOS Distributed Amplifier and Oscillator," 1999, 9 pages, *1999 IEEE International Solid-State Circuits Conference*, no month.

Kleveland, B. et al. (1998). "50 GHz Interconnect Design in Standard Silicon Technology," IEEE MIT-S International Microwave Symposium Digest 3:1913-1916, no month.

Kleveland, B. et al. (1999). "Line Inductance Extraction and Modeling in a Real Chip With Power Grid," *IEEE IEDM Conference*, Washington, D.C. pp. 1-4, no month.

Kleveland, B. et al., "50-GHz Interconnect Design in Standard Silicon Technology," *IEEE MIT-S International Microwave Symposium*, Baltimore, Maryland, Jun. 7-12, 1998.

Kral, A., Behbahani, F., and Abidi, A.A., "RF-CMOS Oscillators with Switched Tuning," *Proceedings of the IEEE 1998 Custom Integrated Circuits Conference*, pp. 555-558, no month.

Larrson, H. (1997). "Distributed Synchronous Clocking Using Connected Ring Oscillators," *Master's Thesis in Computer Systems Engineering, Centre for Computer System Architecture*, Halmstad University: Halmstad, Sweden, 43 pages, no month.

Miller, Brian, "A Multiple Modulator Fractional Divider," *IEEE Transactions on Instrumentations and Measurement*, vol. 40, No. 3, Jun. 1991, pp. 578-583.

MultiGiG Ltd: Rotary Explorer vo. 5 User's Guide, 'online! Apr. 28, 2001, pp. 1-33.

Patent Abstracts of Japan, vol. 010, No. 079 (E-391), Mar. 28, 1986, & JP 60 224205 A (Oki Denki Kogyo KK), Nov. 8, 1985 abstract.

Patent Abstracts of Japan, vol. 016, No. 465 (E-1270), Sep. 28 1992, & JP 04 165809 A (NEC Corp), Jun. 11, 1992 abstract.

Skvor et al., "Novel decade electronically tunable microwave oscillator based on the distributed ampllifier," *IEEE Explore*, Aug. 3, 1992, vol. 28, Issue 17 Abstract.

Skvor et al., "The Distributed Oscillator at 4 GHz," *1998 IEEE, Department Electromagnetic Field*, Czech Technical University in Prague Technicka 2, 166 27 Praha 6, Czech Republic, no month.

Wood, John et al., "Rotary traveling-wave oscillator arrays: a new clock technology," *IEEE Journal of Solid-State Circuits Conference*. Digest of Technical Papers, San Francisco, CA USA, Feb. 5-7, 2001. Vol. 36, No. 11, pp. 1654-1665.

Wu et al., "A 10GHz CMOS Distributed Voltage Controlled Oscillator1," 4 pages, submitted to the Department of Electrical Engineering, California Institute of Technology, no date.

Yue, P.C. et al. (1998). "On-Chip Spiral Inductors with Patterned Ground Shields for Si-Based RF IC's," *IEEE Journal of Solid-State Circuits* 33(5): 743-752, no month.

Porat, Dan I., "Review of Sub-Nanosecond Time-Interval Measurement," *IEEE Trans. on Nuclear Sci*, vol. NS-20, No. 5, p. 36-51 (1973), No Month.

"A 20-Bit (1ppm) Linear Slope-Integrating A/D Converter," *National Semiconductor Application Note 260*, Jan. 1981, (1995).

"EE247 Lecture 16: Data Converters," 2004 H.K., pp. 1-60, No Month.

* cited by examiner

ROTARY FLASH ADC

CROSS-REFERENCE TO RELATED APPLICATIONS

This application claims priority to and incorporates by reference Great Britain application GB 0416803, filed Jul. 27, 2004.

This application is related to U.S. application, titled "DOUBLE FEEDBACK RTWO DRIVEN SAMPLER CIRCUITS", Ser. No. 11/051,989, filed Feb. 3, 2005, and is incorporated by reference into the present application.

The publication, Rotary Traveling-Wave Oscillator Arrays: A New Clock Technology, J. Wood, T. C. Edwards, and S. Lipa, *IEEE Journal of Solid-State Circuits*, Vol. 36, pp. 1654–1665, is incorporated by reference into the present application.

FIELD OF THE INVENTION

The present application relates generally to analog-to-digital converters and more particularly to an analog-to-digital converter with a rotary oscillator.

DESCRIPTION OF THE RELATED ART

At the speeds (in the GHz range) envisaged, only flash ADC architectures have been practical. Flash converters tend to require a large amount of both power and area and are difficult to calibrate.

BRIEF SUMMARY OF THE INVENTION

This invention uses multiphase clocks (preferably rotary clock technology as described in U.S. Pat. Nos. 6,556,089, 6,816,020, and 6,525,618) to implement a high speed time-to-digital based analog-to-digital converter on top of a self-calibrating single-slope ADC. These new rotary clocked devices promise an order of magnitude less power consumption and the potential to improve resolution by one to three bits.

One embodiment of the present invention is a system for converting an analog signal to a digital signal. The system includes a multiphase oscillator, a sample and hold circuit, an integrator, and a time-to-digital converter. The multiphase oscillator has a period of oscillation and provides a plurality of phase signals, each oscillating at the period of the multiphase oscillator. The sample and hold circuit is operative to capture and hold the analog signal in response to a phase signal of the multiphase oscillator. The integrator converts the held analog signal into a pulse having a duration that is proportional to the magnitude of the analog signal. The time-to-digital converter is operative to convert the pulse into a digital signal and includes a plurality of sampling elements, each activated by the pulse and capturing one of the phases of the multiphase oscillator, and a binary counter for counting the periods of the multiphase oscillator. The plurality of flip-flops and the binary counter provide the digital signal.

Another embodiment of the present invention is a method for converting an analog signal to a digital signal. The method includes (i) sampling and holding the analog signal in response to one of a number of phase signals of a multiphase oscillator, and after holding the analog signal, (ii) creating a first transition of a pulse, (iii) integrating a constant reference current until the hold analog signal has a known voltage value to create a second transition of the pulse, and between the first and second transitions of the pulse, (iv) counting oscillator cycles and capturing the state of the oscillator phase signals, where the count of the oscillator cycles and the captured state of oscillator phase signals become the digital signal.

One advantage of the present invention is that conversion happens very quickly as the conversion time is the sum of the sample time and the time-to-digital conversion time. If the sample time is 500 pS and the time conversion time is equal to the sample time, then a full analog-to-digital conversion would occur in about 1 nS.

Another advantage is that there is no need for a calibration cycle that makes the converter unavailable. In the present invention, calibration occurs while the converter is operational and does not interfere with normal operation.

Yet another advantage is that the conversion is highly accurate, the accuracy limit being set by the number of phases of the multiphase clock.

BRIEF DESCRIPTION OF THE DRAWINGS

These and other features, aspects and advantages of the present invention will become better understood with regard to the following description, appended claims, and accompanying drawings where:

DETAILED DESCRIPTION OF THE INVENTION

Overall Operating Principle

The basic operating principle is that of single-slope ADC conversion using a track-and-hold sampler on the input and a multiphase time-to-digital conversion on the output. Fragmentation and interleaving of the ADC construction allows for transparent self-calibration while conversions are in progress.

Figure 1:
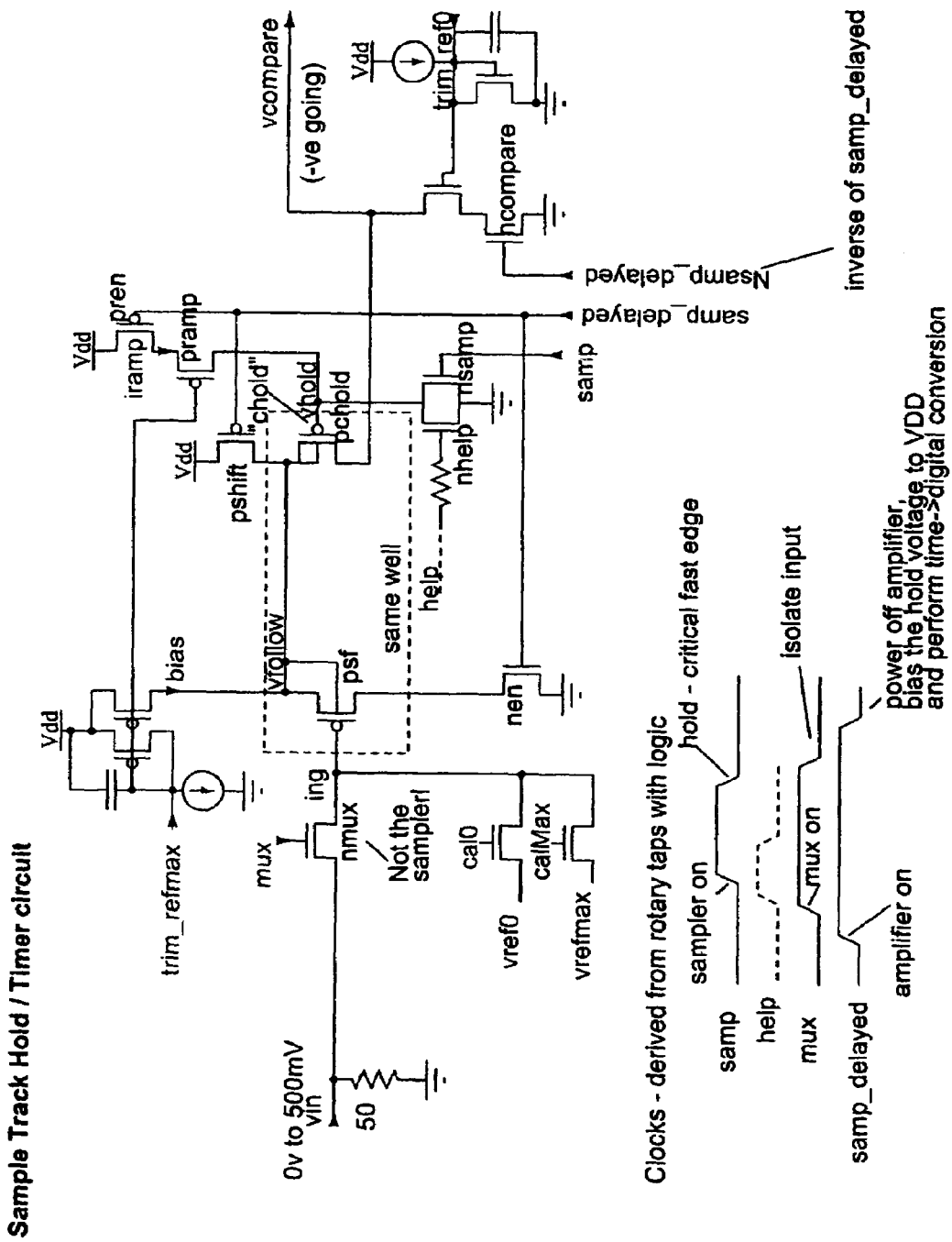
FIG. 1 is the simplified diagram of a sampler and converter technique in accordance with the present invention.

FIG. 1 is the simplified diagram of the new sampler and converter technique constructed on a low cost digital CMOS process where only the PFETs have independent wells (NFET circuits could be used on a true twin-tub process). At the front-end is a voltage buffer and a track and hold circuit. An input multiplexer (not a sampler) is provided to allow auto-calibration, etc. The track and hold circuit shown is a PFET source follower and the sampler capacitor is chosen to be a PFET enhancement mode capacitance formed in transistor PHOLD (which also doubles as the comparator transistor). Of course, a true capacitor could be used.

After the sampler, a single-ramp conversion is performed on the sampled voltage by using a current source iramp to slew the unknown voltage up past a threshold detected by a voltage comparator (or in this case just the PFET turning off with a current sink load). This is the well-known single-slope or "time-to-digital" ADC conversion process. This invention features the high resolution, low power method of implementing the time-to-digital conversion. The ramp is very fast compared to the older single-slope ADCs and slews in the order of 1 volt per nanosecond.

The multiphase time-to-digital conversion block uses many of the potentially infinite number of clock phases to determine the exact time the output edge of the comparator transitioned. Because many phases are available, the time resolution can be made very small. With 1 GHz numerical example, 1000 pS, spread over 10 mm of rotary wire, and with a minimum tapping resolution of 1 micron (via size), there are potentially 10,000 phases available, each phase being 0.1 pS apart in time. It will be explained later how an Nx over-speed rotary clock simplifies the number of phases required.

The main blocks for implementing an embodiment of the ADC include a multiplexer, a source follower, a track and hold circuit, and a time-to-digital converter.

Multiplexer

A multiplexer ahead of the source follower allows the ADC input to be switched between input signals and various calibration reference signals. This is not the sampler transistor.

Source Follower

This circuit is a standard source follower and is gated on and off using n-type transistor. Transistors nmux and pshift also affect the operation of the source follower. The input range is approximately 0 v to 0.75 volts on a typical 0.18 u CMOS process@ 1.8 Volt supply. Output is approximately 0.9 volts higher than the input signal level due to Vth of the PFET. As shown, the circuit suffers from non-linearity due to current source non-linearity and the problem of varying VDS over the input range giving further non-linearity and less than unity gain. Many well-known circuit methods exist to offset these effects and are not shown.

Track/Hold

The most noticeable feature is the use of a PFET transistor pchold whose poly gate capacitor acts as the sampling capacitor "chold". This is permissible because the FET is always operating in the enhancement region of operation and the gate is therefore a quality capacitance. Other capacitor types are possible, but are not present on low-cost CMOS. The voltage vfollow tracks the input voltage during the time samp level is high. The gate capacitance of pchold stores this signal by virtue of the gate being grounded through nsamp.

Sampler Transistor

The hold/sample transistor nsamp is configured in an unconventional way. Because it holds the gate of pchold to ground during the signal-track phase of operation, it operates without any significant VDS voltage. This has many advantages and is especially important during the hold phase of operation where the turn-off charge-injection becomes constant, since the drain voltage is zero and independent of input signal. The sampler transistor can connect directly to the rotary clock for a very fast edge rate (several pS) and high stability (low phase noise). An optional charge injection nullification transistor is not shown for clarity.

Transistor nhelp is significantly smaller than nsamp and waveform help makes the rotary clock ring more decoupled from the input signal. The resistor indicates a non-adiabatic tap for this smaller transistor (more likely through a buffer from the clock), which is present to ensure that the main NFET (directly rotary clocked) is switched on with nearly zero Vds (turn off is already guaranteed to be a zero Vds). Since samp comes directly from the rotary clock signal, coupling from drain to gate is to be avoided especially around the locally most sensitive ISF (Impulse Sensitivity Function) point of the oscillator in the rotary clock period.

To make use of the voltage stored on vhold the opposite side of the "chold" capacitance, i.e., vfollow must be referred to some known reference. That is the purpose of transistor pshift, which pulls vfollow to VDD after the sample is completed.

In operation of the track and hold circuit, the input voltage is translated and level-shifted according to the relation, Vhold=VDD−Vin−Vgs (psf).

Ramp Timer/Comparator

Transistor pramp provides a current for turning the sampled voltage into time interval through the equation CV=IT. Vhold ramps towards VDD once samp-delayed goes low. Charge is taken out of the gate capacitance of pchold (the sampler capacitance) until the gate voltage is no longer able to sustain the drain current imposed by the ncompare current sink path. At this point, the time of which is proportional to the sampled input voltage, vcompare goes negative, indicating the end of the ADC conversion process.

Time-to-Digital Converter

Figure 2:
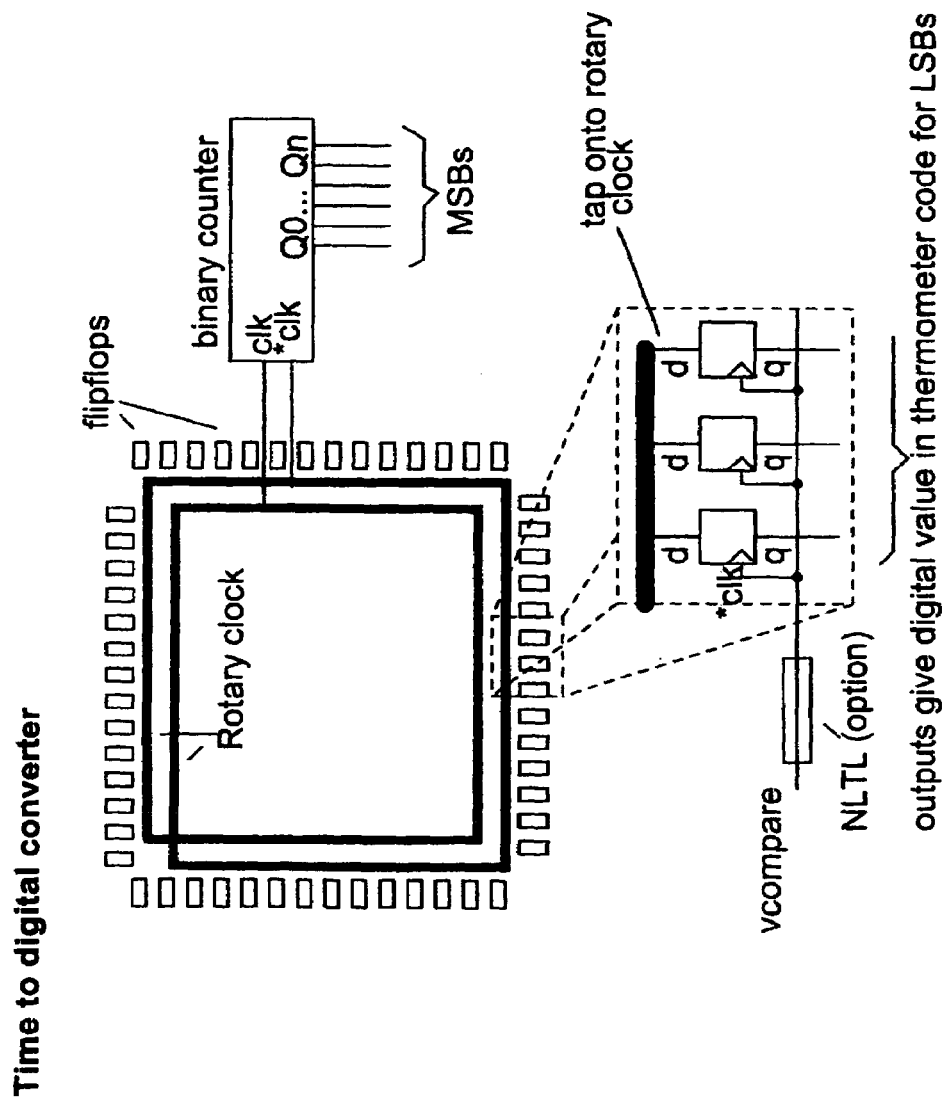
FIG. 2 shows an embodiment of a time-to-digital converter system in accordance with the present invention.

The time-to-digital converter circuit shown in FIG. 2 is similar to the circuits that are currently in use in particle physics where time-to-digital techniques measure the arrival time of signals from particle detectors. Another use of time-to-digital is in time-of-flight measurements for devices like optical range-finders. To measure a time period of a digital signal, the edge of the pulse must be timed. By using a multiphase array of sampling elements (typically D flip-flops) with each data input driven by a different phase of a multiphase clock and the clock of all FFs driven by the input pulse, it is possible to determine the time (or clock phase) at which the edge occurred to a high sensitivity, at least more sensitive than counting integer clock counts. The time-to-digital converter for use in this ADC application uses a rotary clock loop which has an infinite number of phases available thereby, in principle, giving infinite time resolution for the converter. The output is a bargraph or thermometer code representing the digitized result.

Practically speaking, the limits are given by the rise and fall times achievable on the rotary clock and on the vcompare signal. Extremely rapid rise and fall times are needed to allow the sampling elements (in this case D-type flip-flops) to come to an unambiguous decision as to the captured logic state. Ultimately, the metastability resolves itself, but unless the edges are defined sharply, the thermometer code may have "bubbles" and could be non-monotonic. Taps on the rotary clock need not be linearly spaced and could advantageously be made at non-linear consecutive phase tappings. This can account for any known non-linearity of the transfer function of Vin→time out.

The circuit shown in FIG. 2 uses standard flip-flops but optimized flip-flops that take advantage of the non-overlapping clocks can resolve smaller time differences.

Non-Linear Transmission Line (NLTL)

One well-known method of increasing the sharpness of an edge beyond the capability of the CMOS inverter rise time (the fastest conventional component in a CMOS process) is the use of a non-linear transmission line.

Figure 3:
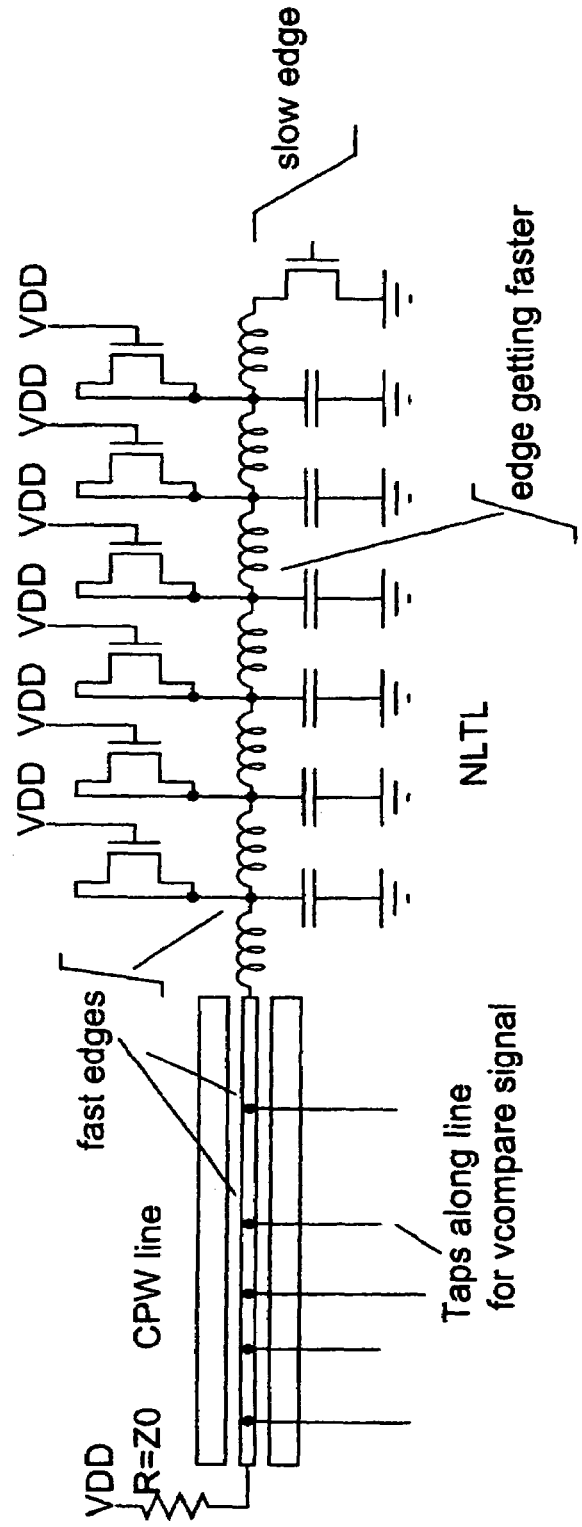
FIG. 3 shows an embodiment by which a highly nonlinear line is constructed.

In FIG. 3, a method of constructing a highly non-linear line is shown. During passage of a pulse edge, the capacitance seen by the transmission line pulse drops sharply as the line passes (VDD−Vth) of the NFET, at which point the gate oxide capacitance becomes disconnected and only the depletion capacitance is seen. This means the lines operate in a shock-wave mode and can achieve sub-picosecond rise times. VDD can be changed to change the onset of non-linear behavior and control the edge rate.

For sharpening of the vcompare pulse, an artificial NLTL is created which can feed into a conventional CPW line to drive the sampler elements. Note that the closing velocity of the vcompare and rotary clock pulses is now important when the vcompare is distributed as a transmission-line. Typically, because of loadings, the CPW is much faster than the RTWO speed.

Self-Calibration Requirements/Technique

CMOS circuits have well-known problems with low noise operation especially at low power levels and especially with 1/f low frequency noise. To obtain high accuracy at low power consumption on CMOS requires some kind of calibration scheme that can correct for low frequency drift in the components. Usually, calibration of ADCs is performed at power-up prior to operation, when the ADC input is able to be switched between various known reference voltages and the results are recorded be a control circuit. By applying various digitally-controlled feedback to the internal components of the ADC, a closed-loop self-correction scheme can overcome most of the initial imperfections of ADC construction due to process variation.

Fragmentation and Interleaving

Figure 4:
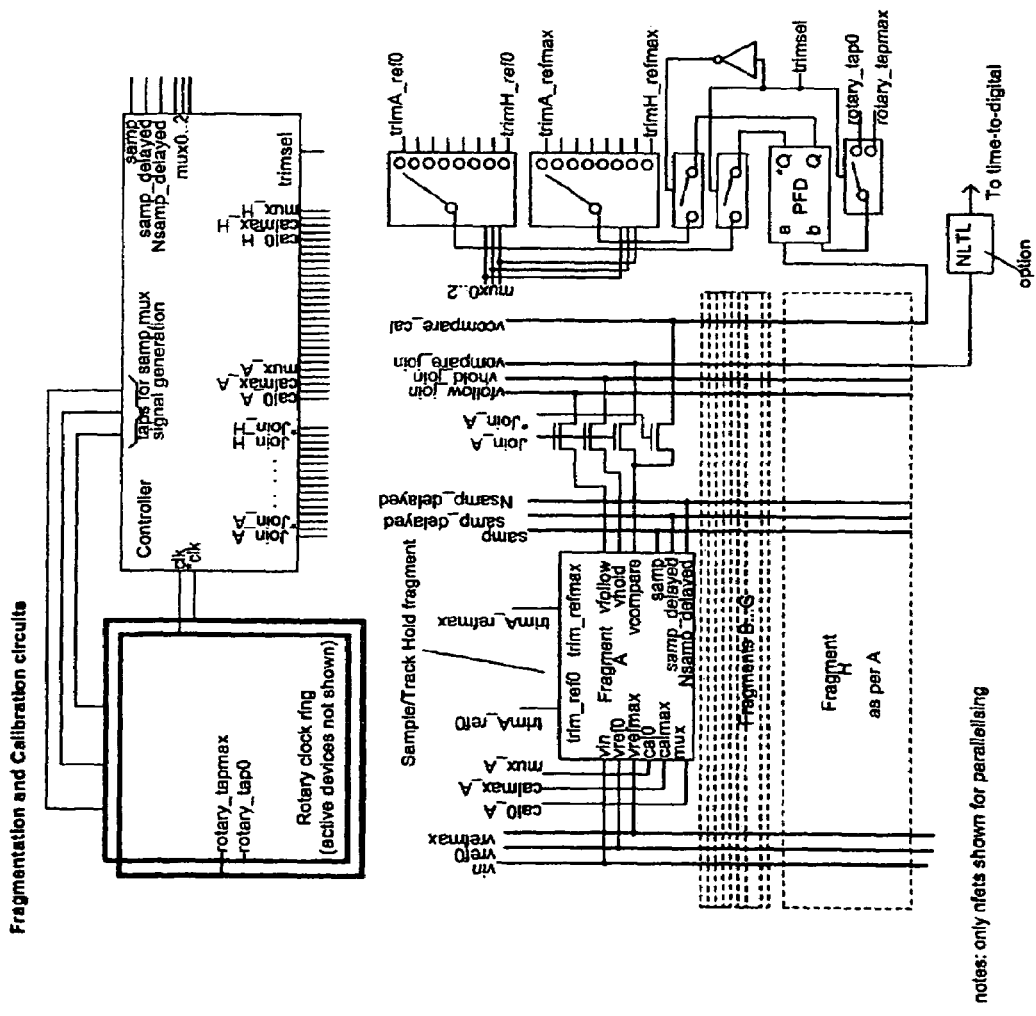
FIG. 4 shows a technique for interleaving and control for transparent self-calibration.

FIG. 4 shows an alternative self-calibration system is proposed here for the ADC. The self-calibration system operates at all times and can therefore correct for low frequency 1/f noise and for supply and temperature variation.

The system is a response to two observations. First, it is observed that the sizes of transistors and capacitors used in an ADC circuit are determined mainly by noise requirements. For example, the sampling capacitor must be large enough for the kT/q sampling noise to be below 1 LSB, where k is the Boltzmann constant, T is the absolute temperature, and q is a standard charge. Another example is the sizing of the source-follower transistor which is determined by the noise contribution of the transistor. Larger devices exhibit less noise simply because of the averaging effect of the larger channel.

Second, it is observed that sizing on CMOS layouts is achieved for each transistor by paralleling multiple "stripes" of transistors together to make up the required channel width. Each stripe is identical to the other stripes. Similarly, with capacitors and resistors, a predefined layout is repeated and paralleled together.

In this embodiment, the ADC is made up of multiple identical fragments which would ordinarily be wired in parallel to make up the sizing. These "undersized" (for noise at least) ADC circuits fragments when in parallel form a low noise ADC. The parallelization of fragments is made "soft" and can be controlled by a sequencer that connects the fragments together at multiple electrical points using Mosfet switches. When connected together, averaging of the circuit voltages and currents occur and noise is reduced in the usual way. In a typical array of 10 fragments, 9 fragments are operated in low-noise parallel mode, while one fragment is self calibrating, either with input=zero or input=maximum (or intermediate points for multipoint slope correction—not described). The selected calibration fragments are sequenced in turn so that over many complete ADC cycles, all fragments are passed through the zero and full scale calibration cycles. This is transparent to the overall external operation of the converter. On any given ADC conversion, 9 converter fragments form the result, reducing the noise. The overhead is therefore quite small.

Description of the Fragmentation Diagram

A controller circuit is clocked by the rotary clock and contains a simple state machine to sequence the fragments as outlined above.

If fragment 0 is to be trimmed, output Join_A becomes 0 and Join_B.H are active high to parallel fragments B.H and these units work together in parallel, noise-averaging mode to do the conversion.

Fragment A can self-correct for min or max range input reference. If the min-voltage is to be auto trimmed, trimsel is high and cal0_A is high, cahmax_A is low, as are mux_A and cal0_B. . . cal0_H and calmax_B. . . calmax_H. Signals mux0. . . 2 are at code 0. All the converter fragments go through their sample and hold and monostable analog→pulse width. Fragment A in this case has its time output compared with the rotary clock phase which corresponds to the zero ADC code. A standard edge-triggered PFD (phase frequency detector) is used and the charge pump output is routed to the trimA_ref0 node. The state machine ensures that similar self-correction occurs for full-scale reference input with output to trimA_refmax (a charge integration node) at the appropriate later time slot (alternating with zero trims) and compares with the Max tap rotary clock phase at the PFD.

The state machine moves through all the fragments and operates for zero and max analog reference voltages. This occurs at such a fast rate that there is effectively a servo feedback system trimming the gain and offset of all ADC fragments independently. This eliminates the low frequency 1/f noise and temperature and process drift of the converter. Because all the fragments are servo'ed to the same reference points, then, during the joining/parallelization of the fragments, there are only small differences in nominal signal levels except for the high-frequency (on the order of many cycles periodicity) changes which the parallelization averages out.

Note that rotary tapmax and rotary_tap0 are shown for the simplistic multiphase rotary clock and need to be augmented with logic to work with the multiple-rotation time circuits which use MSB counters.

Low Noise Rotary Clock

ADCs require the lowest possible jitter in the sampling clocks. Jitter is analogous to phase noise. In a paper in *IEEE JSSC*, titled "A FILTERING TECHNIQUE TO LOWER LC OSCILLATOR", Emad Hegazi, et al. *IEEE Journal of Solid-State Circuits*, Vol. 36, No. 12, December. 2001. pp 1921–1930, Hegazi finds that, by eliminating power energy to a resonant circuit at even harmonics (particularly the 2nd harmonic), phase noise (and consequently jitter) can be greatly reduced. One option is to add LC resonant circuits at each of the back-back inverters in the power rails, but the area overhead of this approach would be prohibitive and the LC circuit would only be responsive at one harmonic.

Because rotary clocks are not resonant in the conventional sense, a rotationally equivalent power sourcing network with the appropriate frequency selectivity is required.

Figure 5:
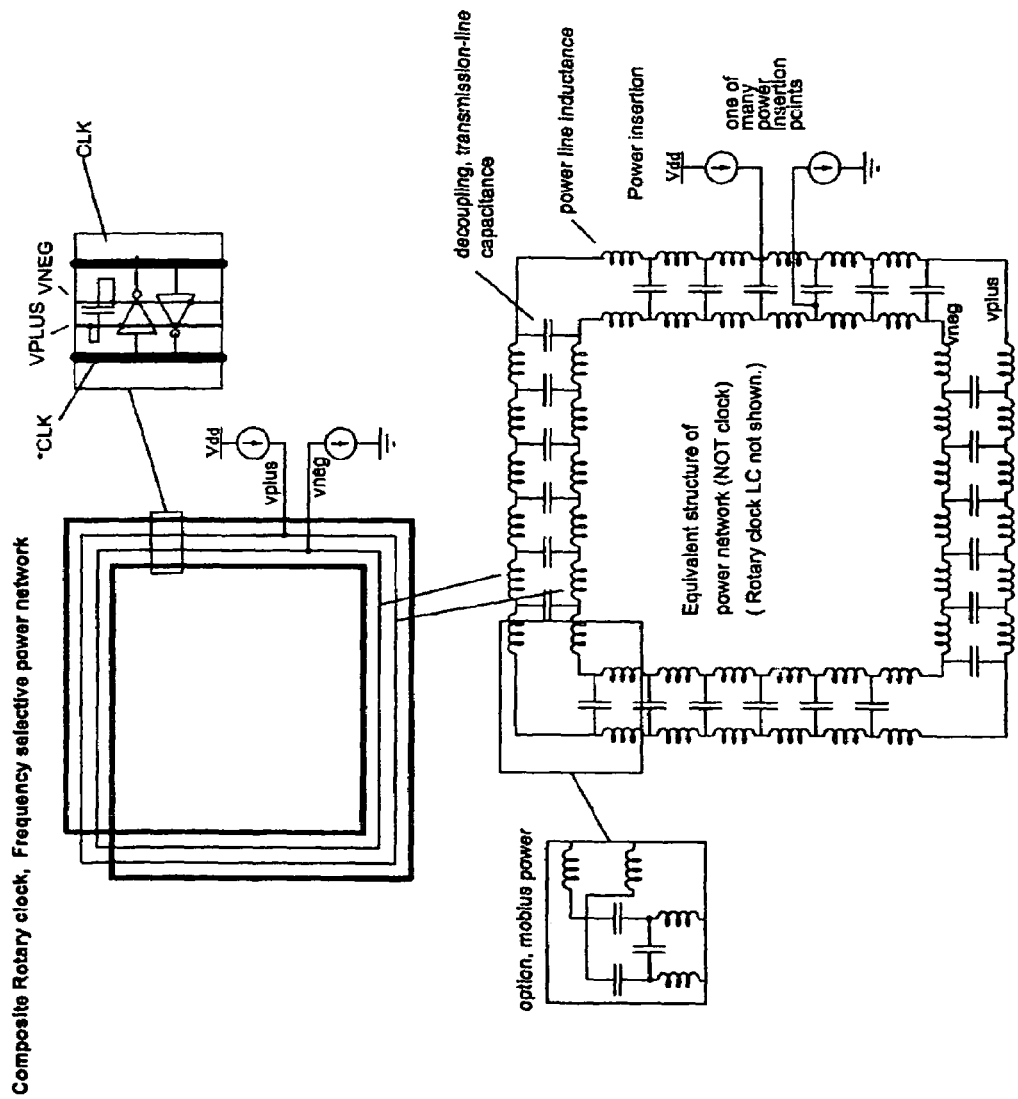
FIG. 5 shows a tuned power network for high 2 F and other harmonic impedance.

FIG. 5 shows how this can be achieved. A ring structure is formed for the Vplus and Vneg power supply wires that supply the back-to-back inverters of the rotary clock circuit with power. Inductance is part of the wire characteristic and the capacitance is added to tune the power line to match the rotary clock time (adjusted for the 2 F vs. 1 F frequency difference).

The closed electromagnetic path of the power network is frequency selective. For example, in the two-wire non-Mobius version of the power network, when a supply demand occurs by one of the back-to-back inverters (the switching elements that maintain the traveling wave) at one instant in time to top up the edge of a clock wave traveling in the independent RTWO loop, the inverters cause a voltage dip in the local vplus, vneg levels (where the magnitude determined by the current and ½ of the impedance of the power transmission line). This dip propagates around the power supply loop at the characteristic velocity arriving back at the same location in one rotation time of the power loop (which should be set to be twice as fast as the rotary clock time constant). Assuming this rotation time could be made to be ½ * (1/Fclock), then the power network is unable to supply power at 2× the rotary clock frequency, thereby achieving the effect desired in the Hagazi reference. This effect applies to all switching elements (such as back-to-back inverters) tapped onto the power loop because of rotational positional and time domain symmetry of the lines. Unlike LC resonant circuits, the rotational circuits are responsive to multiple harmonics.

For maximum impulse-sensitivity function (ISF) immunity, the two rotational operating speeds of Rotary Loop and Power Network can be designed slightly offset from simple multiples. This can promote the 'top-up' of energy at the minimum ISF sensitivity point.

There are two options for constructing the power supply transmission line loop. Mobius and non-Mobius are both shown. The Mobius version uses large coupling capacitors to induce a signal inversion for AC signals on the loop (DC levels un-affected). This configuration doubles the electrical length of the line for purposes of analyzing the time of flights and might be useful to reduce the amount c loading.

Note that the signals vplus and vneg are not identical at all points of the ring because of the rotating currents and voltages on the line.

Although the present invention has been described in considerable detail with reference to certain preferred versions thereof, other versions are possible. Therefore, the spirit and scope of the appended claims should not be limited to the description of the preferred versions contained herein.

What is claimed is:

1. A system for converting an analog signal to a digital signal, the system comprising:
   a multiphase oscillator having a period of oscillation and providing a plurality of phase signals, each oscillating at the period of the multiphase oscillator;
   a sample and hold circuit for capturing and holding the analog signal in response to a phase signal of the multiphase oscillator;
   an integrator for converting the held analog signal into a pulse having a duration that is proportional to the magnitude of the analog signal; and
   a time-to-digital converter for converting the pulse into a digital signal, the time to digital converter including a plurality of sampling elements, each activated by the pulse and capturing one of the phase signals of the multiphase oscillator, and a binary counter for counting the periods of the multiphase oscillator;
   wherein the plurality of sampling elements and the binary counter provide the digital signal.

2. A system for converting as recited in claim 1, wherein the plurality of sampling elements hold a thermometer code whose bits give the least significant bits of the digital signal.

3. A system for converting as recited in claim 1, wherein the binary counter has bits that give the most significant bits of the digital signal.

4. A system for converting as recited in claim 1, wherein the multiphase oscillator is a rotary oscillator.

5. A system for converting as recited in claim 1,
   wherein the pulse has a particular transition speed; and
   further comprising an edge sharpening circuit connected between the integrator and the time-to-digital converter to improve the transition speed of the pulse.

6. A system for converting as recited in claim 5, wherein the edge sharpening circuit includes a non-linear transmission line that increases the transition speed of the pulse as the pulse traverses the line.

7. A system for converting as recited in claim 1,
   wherein the sample and hold circuit is formed from a plurality of sample and hold fragments;
   wherein the integrator is formed from a plurality of corresponding integrator fragments; and
   further comprising a calibration circuit for calibrating the converter during the operation of the converter, the calibration circuit calibrating one of the plurality of sample and hold and corresponding integrator fragments while the other sample and hold and corresponding integrator fragments are used in the operation of the sample and hold circuit.

8. A system for converting as recited in claim 7,
   wherein each of the fragments has at least one trim input signal;
   wherein the calibration circuit includes:
      a controller connected to receive timing signals from the multiphase oscillator, and operative to provide multiplexer control signals, fragment selection signals, and fragment join signals, the selection signals selecting one of the fragments for calibration and the join signals connecting together non-selected fragments for operation of the converter;
      a multiplexer connected to the controller to receive the multiplexer control signals and an error signal, the multiplexer providing a plurality of trim input signals to the fragments based on the multiplexer control signals and the error signal; and
      a phase frequency detector that receives the pulse output of the integrator and a reference signal, the phase frequency detector being operative to compare the pulse output of the integrator with the reference signal to provide the error signal to the multiplexer.

9. A system for converting as recited in claim 1,
   wherein the multiphase oscillator is a rotary oscillator, which includes switching elements that maintain a traveling wave on the oscillator; and
   further comprising a power network for supplying power to the switching elements of the rotary oscillator, the power network having the form of a loop and a rotation time that is approximately one-half the oscillation period of the rotary oscillator so as to prevent the power network from supplying of power to the rotary oscillator at the second harmonic of the frequency of the rotary oscillator.

10. A system for converting as recited in claim 9, wherein the power network is a Mobius power network and has at least one power insertion point.

11. A system for converting as recited in claim 9, wherein the power network is a non-Mobius power network and has at least one power insertion point.

12. A system for converting as recited in claim 9, wherein the rotation time of the power network is slightly offset from being one-half the oscillation period of the rotary oscillator so as to improve impulse-sensitivity function immunity.

13. A method for converting an analog signal to a digital signal, the method comprising:

sampling and holding the analog signal in response to one of a number of phase signals of a multiphase oscillator, each of said phase signals being active during a different portion of an oscillator period, a state of the oscillator phase signals being determined by the phase signals that are active at a sampling instant; and after holding the analog signal,
creating a first transition of a pulse,
integrating a constant reference current until the hold analog signal has a known voltage value to create a second transition of the pulse, and
between the first and second transitions of the pulse, counting oscillator cycles and at a sampling instant defined by the second transition, capturing the state of the oscillator phase signals, wherein the count of the oscillator cycles and the captured state of oscillator phase signals become the digital signal.

14. A method for converting as recited in claim 13, wherein the captured state of the oscillator phase signals has the form of a thermometer code.

15. A method for converting as recited in claim 13,
wherein said first and second transitions each have a transition time;
further comprising decreasing the transition times for the first and second transitions of the pulse.

16. A method for converting as recited in claim 13, performing a calibration operation during the sampling and holding steps.

17. A method for converting as recited in claim 16,
wherein the steps of sampling and holding, and integrating are performed by circuitry composed of a plurality of fragments and each fragment has a trim input; and
wherein performing the calibration operation includes:
selecting out one of the plurality of circuitry fragments for calibration;
detecting an error between the circuitry fragment and a reference signal; and
applying the error to the trim input of the circuitry fragment to reduce the error.

\* \* \* \* \*